HIGH GAIN FIELD-EFFECT TRANSISTOR-LOADED AMPLIFIER

Filed Jan. 20, 1964 3 Sheets-Sheet 1

INVENTORS
EDWARD E. MITCHELL
MAURICE G. GILLILAND
ROBERT Z. FOWLER
EDGAR W. SEYMOUR

BY Lawrence C. Laubscher
ATTORNEY

Nov. 15, 1966 E. E. MITCHELL ETAL 3,286,189
HIGH GAIN FIELD-EFFECT TRANSISTOR-LOADED AMPLIFIER
Filed Jan. 20, 1964 3 Sheets-Sheet 2
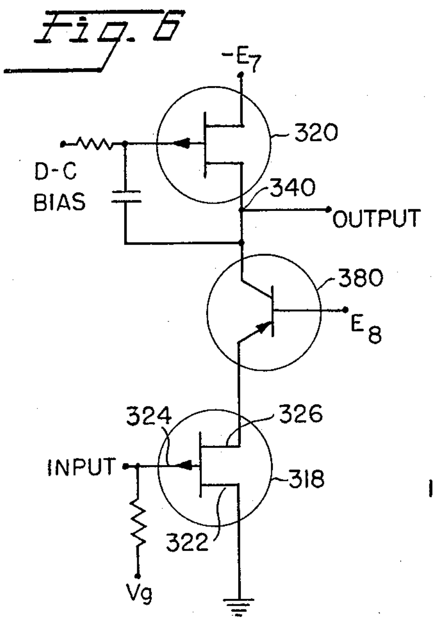
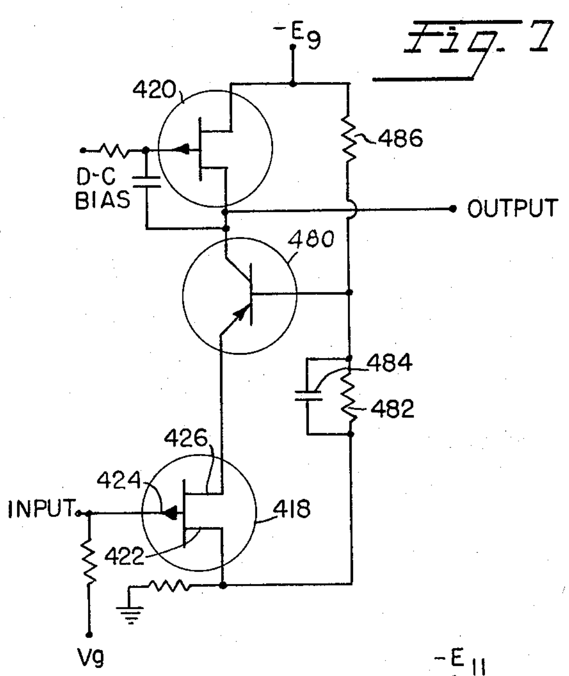
FIG. 6, FIG. 7
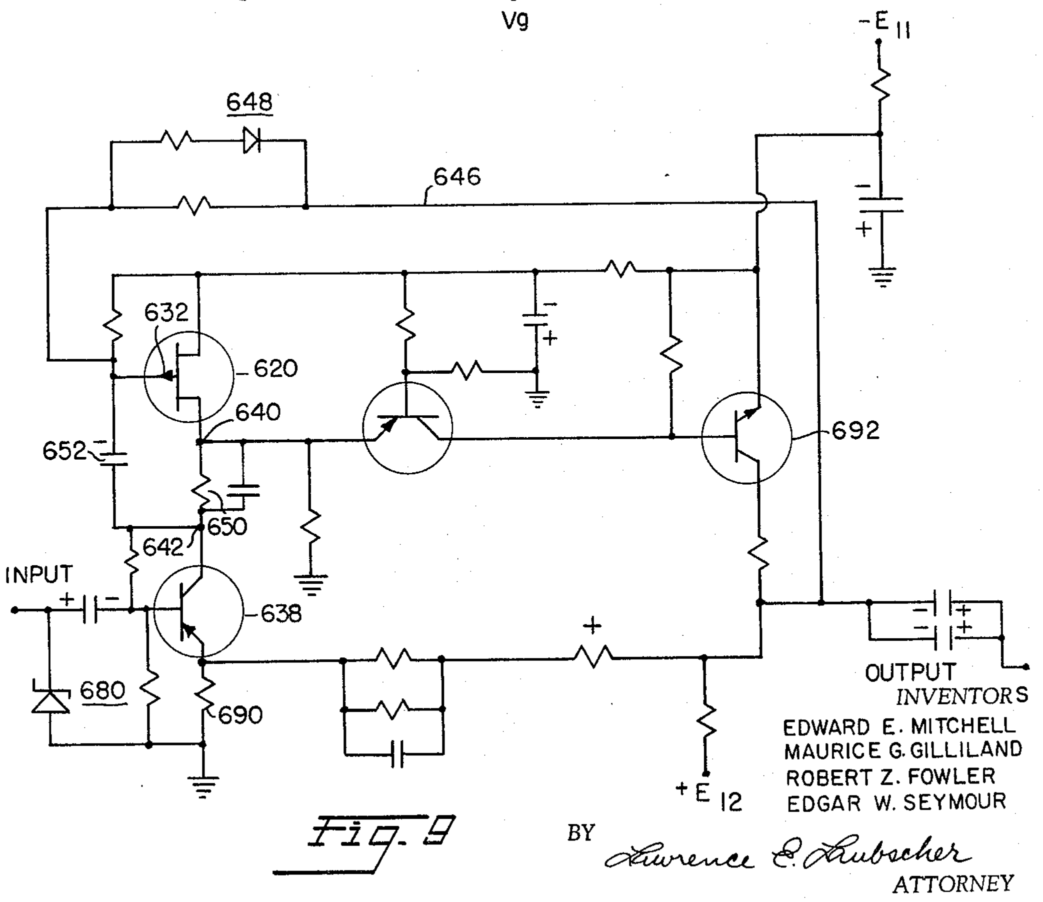
FIG. 9
INVENTORS
EDWARD E. MITCHELL
MAURICE G. GILLILAND
ROBERT Z. FOWLER
EDGAR W. SEYMOUR
BY
ATTORNEY

HIGH GAIN FIELD-EFFECT TRANSISTOR-LOADED AMPLIFIER

Filed Jan. 20, 1964 3 Sheets-Sheet 3

INVENTOR
EDWARD E. MITCHELL
MAURICE G. GILLILAND
ROBERT Z. FOWLER
EDGAR W. SEYMOUR
BY
Lawrence E. Laubscher
ATTORNEY United States Patent Office 3,286,189

Patented Nov. 15, 1966

3,286,189

HIGH GAIN FIELD-EFFECT TRANSISTOR-LOADED AMPLIFIER

Edward E. Mitchell, Maurice G. Gilliland, and Robert Z. Fowler, Ithaca, and Edgar W. Seymour, Freeville, N.Y., assignors to Ithaco, Inc., Ithaca, N.Y., a corporation of New York Filed Jan. 20, 1964, Ser. No. 338,985

8 Claims. (Cl. 330—18)

This invention relates generally to low noise amplifiers, and more particularly to solid-state small signal amplifiers that are loaded by field-effect transistor means.

The field-effect transistor is a relatively recent development in the solid-state electronics art. An example of such a device is disclosed in the U.S. patent to Schockley No. 2,744,970 of May 8, 1956. The field-effect transistor (FET) is a three-terminal device having source, drain and gate electrodes. Both the source and drain are so biased relative to the gate electrode that PN junctions between contiguous zones of the semi-conductor are biased in the reverse direction. The potential of the drain, however, is substantially greater than that of the source. Signals to be amplified are applied between the source and gate electrodes, whereby variations in the potential of the gate electrode control the conductivity of the path for the flow of electrical carriers in the intermediate zone from the source to the drain.

The field-effect transistor has an amplification characteristic that is similar to that of a vacuum pentode. It is a voltage controlled device and its input impedance can be very high. In addition, its signal current is composed of carriers of one polarity only—a factor which eliminates many of the noise sources associated with conventional transistors. These two characteristics make the field-effect transistor a highly desirable device for use in amplifiers that operate from high impedance sources, such as the piezoelectric transducer of a hydrophone, or with other medium-to-high impedance sources where outstanding noise performance is required.

As is known in the art, the voltage gain of a transistor amplifier is substantially equal to the product of the transconductance of the transistor and its load resistance. The largest value of load resistance, and consequently the highest gain of the amplifier, is determined by the available power supply voltage and by the quiescent current of the transistor at the particular operating point.

A primary object of the present invention is to increase the gain of a solid-state small signal amplifier by loading the device with a field-effect transistor in place of the conventional resistor load. Preferably, the signal amplifying device that is loaded by the field-effect transistor is also a field-effect transistor, although the invention is applicable to the loading of conventional transistor amplifiers as well. Since the field-effect transistot load may be caused to have a high impedance, the gain of the associated amplifer may be increased without adversely affecting amplifier operation. As compared with the use of a conventional load resistor, the use of an FET load produces improved noise performance, increased bias stability, and decreased power consumption by the amplifier circuit.

A more specific object of the invention is to provide a multi-stage solid state amplifier the input stage of which includes as its load a field-effect transistor having a gate electrode to which is applied, by suitable feedback means, a portion of the amplified output signal from a subsequent amplifier stage. By such a feedback control, the operating level of the source electrode of the FET load, the drain or collector electrode of the amplifier device, and other points of the amplifying circuit are stabilized in an accurate, noise-free manner.

A further object of the invention is to bias the gate electrode of a field-effect transistor small signal amplifier by means including single or back-to-back diodes which determine the gate bias. This feature results in higher input impedance, better noise performance for high input impedance circuits, and faster initial settling time and faster recovery for saturating transients for equivalent amplifier bandwidth.

Another object of the invention is to provide a field-effect transistor-loaded amplifier having a resistor connected in series between the amplifier device and the source electrode of the field-effect transistor, whereby the circuit input impedance is further increased and the noise contributed by the FET load is decreased. According to a feature of the invention, a capacitor is connected between the end of this resistor adjacent the amplifier device, and the gate electrode of the FET load, whereby independent biasing of the FET load is permitted and consequently the current of the FET load may be regulated in accordance with the requirements of the solid-state amplifier device. The output of the amplifier stage is taken from the source electrode of the FET load, whereby the effective current gain of the amplifier is further increased.

A further object of the invention is to provide a field-effect transistor-loaded amplifier including a conventional transistor in grounded base arrangement for isolating the amplifier device from its FET load. Such an arrangement reduces the loading effect of the drain resistance of the amplifier device and thereby increases the voltage gain of the amplifier stage. Furthermore, the isolating transistor lowers input capacitance, thereby reducing the deleterious "Miller effect" capacitance. According to another feature of the invention, a resistor may be connected between the base of the isolating transistor and the source of a field-effect transistor amplifier to provide for "bootstrapping" of the drain of the amplifier. A capacitor may be connected in parallel with this bootstrapping resistor to eliminate the effect of drain-gate capacitance at the input of the circuit.

Other objects and advantages of the invention will become apparent from a study of the following specification when considered in conjunction with the accompanying drawing, in which:

FIGURE 6 illustrates a field-effect transistor amplifier circuit including conventional amplifier means for isolating the amplifier from its load;

FIGURE 7 is a modification of the circuit of FIGURE 6; and

FIGURES 8 and 9 illustrate improved low noise amplifier systems including the novel features of the invention.

Figures 1, 2:
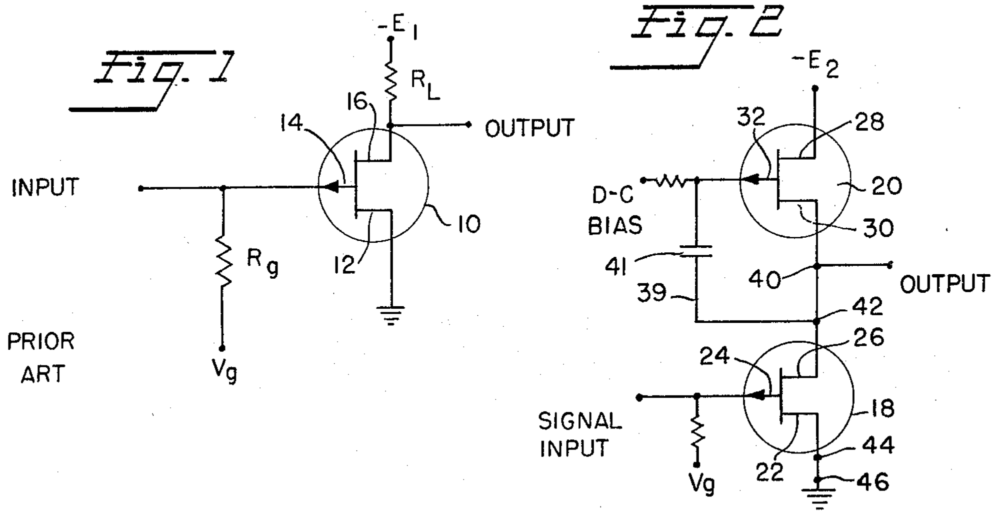
FIGURE 1 illustrates a conventional field-effect transistor amplifier circuit for producing a voltage gain.
FIGURES 2 and 3 illustrate the use of field-effect transistors as drain and collector loads in field-effect transistor and conventional transistor amplifier circuits, respectively.

Referring to the basic circuit of FIGURE 1, the field-effect transistor 10 includes conventional source, gate and drain electrodes 12, 14 and 16, respectively. In the illustrated embodiment, the device is of the P base type, and consequently the drain is connected with a negative supply $E_1$ through drain load resistor $R_L$, source 12 being connected with ground. The input signal is applied to the gate electrode 14 which is biased to a desired D.-C. operating potential by a source of biasing voltage V*g* and gate resistor R*g*. The voltage gain of the circuit of FIGURE 1 is very nearly equal to the product of the transconductance of the transistor (*gm*) and the resistance value of the load resistor ($R_L$). The largest value of $R_L$ that can be used, and hence the highest gain that may be achieved, is determined by the available power supply voltage and by the quiescent current of the transistor at the particular operating point.

In accordance with one important feature of the present invention, an increase in the gain of a transistor is obtained by substituting for the load resistor $R_L$ of FIGURE 1 a "current source" or high load impedance device. As its name implies, an ideal current source provides a current that is independent of the applied voltage, and therefore exhibits very high impedance $$(\Delta E/\Delta I=\alpha$$

for an ideal current source). Since high load impedance contributes directly to high gain, the current source approach constitutes an important technique for increasing the gain of an amplifier.

Referring now to FIGURE 2, in order to increase the gain of field-effect transistor amplifier 18, a second field-effect transistor 20 is provided as the drain load of transistor 18. Thus, transistor 18 includes a grounded source electrode 22, a gate electrode 24 upon which the input signal is applied, and a drain electrode 26 from which the output is taken. Drain electrode 26 is connected with the negative supply $E_2$ via the source to drain circuit of transistor 20. The drain electrode 28 of FET 20 is connected with supply, the source electrode 30 is connected with the drain electrode 26 of FET 18, and gate electrode 32 is connected with the D.-C. biasing voltage source and with the drain of amplifier 18 by conductor 39 and capacitor 41. The amplified output signal is taken from output junction 40 adjacent the source electrode of FET load 20. As compared with the load resistor circuit of FIGURE 1, the FET load circuit of FIGURE 2 affords increased gain, improved noise performance, increased bias stability, and a decrease in power consumption of the amplifier circuit.

Figures 3, 4:
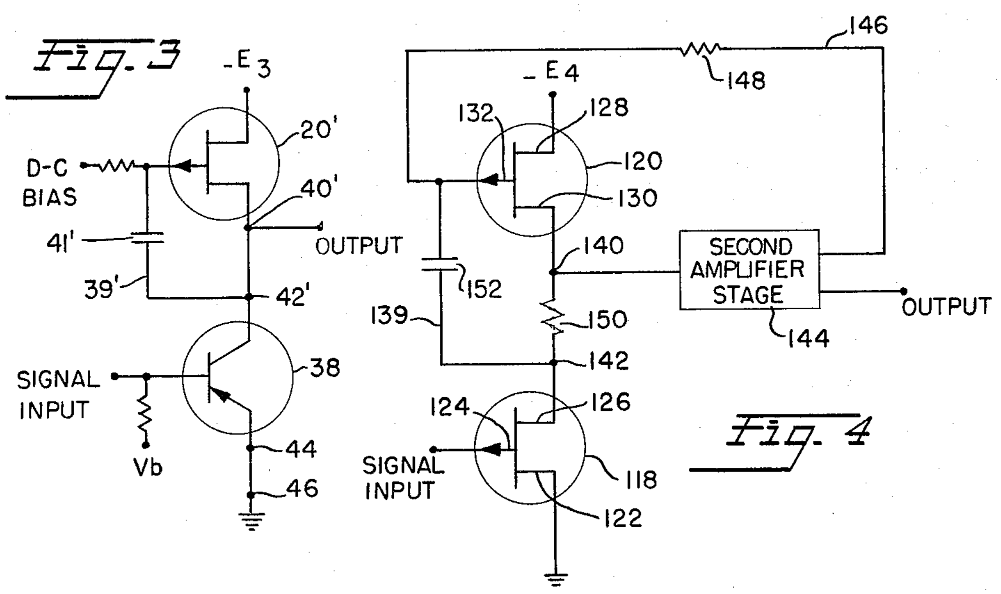
FIGURE 4 illustrates a multi-stage amplifier including feedback to the gate electrode of a field-effect transistor utilized as the load of an initial stage.

Similarly, as shown in FIGURE 3 a field-effect transistor 20' is used as the collector load of a conventional P-N-P transistor 38, whereby the load impedance and gain of the amplifier are increased. The emitter, base, and collector electrodes of transistor 38 correspond with the source, gate and drain electrodes of FET 18. In both the FIGURES 2 and 3 amplifier devices, a signal applied to an input control electrode of the amplifier device effects control over the effective current flowing between two power circuit electrodes. Depending on circuit parameters and desired operation, resistors of suitable value may be connected between junction 40 and 42 and between points 44 and 46 in the circuits of FIGURES 2 and 3.

A specific advantage resulting from the use of a field-effect transistor as the load means in the transistor amplifier circuits of FIGURES 2 and 3 is the accurate, positive means afforded for feedback stabilizing control in multi-stage amplifier systems. Referring now to FIGURE 4, the output appearing at junction 140 from the first stage FET amplifier 118 is conducted to the input of a second stage amplifier 144. A portion of the output of the second stage amplifier 144 is fed back to the gate electrode 132 of FET 120 via conductor 146 and feedback resistor 148. As shown in FIGURE 4, a resistor 150 is connected in series between source 130 of FET 120 and drain 126 of FET 118, and a capacitor 152 is connected at one end with gate electrode 132 of load FET 120 and at the other end with junction 142 intermediate resistor 150 and the drain electrode 126 of FET 118. Since resistor 150 is connected in series with the source to drain circuit of load FET 120, the resistor affords an additional increase in the circuit input impedance and also reduces the noise contributed by FET 120. As in FIGURES 2 and 3, an advantage resulting from the use of capacitor 152 is that independent voltage biasing of the FET load 120 is permitted, and hence its current is regulated in accordance with the requirements of FET amplifier 118. Furthermore, it is important to note that by using source 130 of load FET 120 as the first stage output terminal (rather than the drain 126 of FET 118), the effective current gain of the total circuit is increased by approximately $R_{150}\ gm_{120}$. Since gate electrode 132 of field-effect transistor load 120 is utilized as the terminal to which feedback is applied from a later stage of the amplifier, it is apparent that the operating level of source 130 of FET 120, the drain 126 of FET 118 (or, in the cause of the embodiment of FIGURE 3, the collector of a conventional transistor), and other points in the amplifier are stabilized in an effective, simple manner. FIGURE 9 illustrates the analogous feedback control to the gate electrode of a field-effect transistor that is used as the load of a conventional transistor amplifier.

Figure 5:
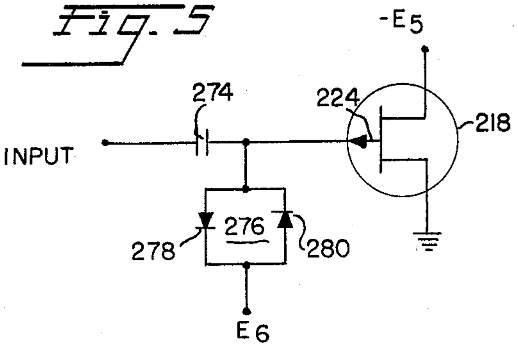
FIGURE 5 is a detailed circuit of one embodiment of diode means for determining the operation bias of the gate electrode of a field-effect transistor small signal amplifier.

According to a further feature of the invention, single (FIGURE 8) or back-to-back (FIGURE 5) diode means may be utilized in place of a conventional gate resistor (R*g* in FIGURE 1) for determining the operation bias of the gate electrode of a field-effect transistor small signal amplifier. As shown in FIGURE 5, the input signal is applied to the gate electrode 224 of FET 218 via coupling capacitor 274. A suitable biasing voltage $E_6$ is applied to gate 224 via a diode network 276 that includes oppositely-poled diodes 278 and 280 connected in parallel. It is apparent that when the bias voltage $E_6$ is above gate potential one of the diodes is conductive and applies the bias voltage upon the gate. If the gate potential should momentarily rise above the bias voltage (for example, as might occur as a result of transients during initial energization of the amplifier), the first diode becomes non-conductive and the other diode becomes conductive. Consequently, this diode biasing arrangement affords a maximum input impedance which is greater than that obtained by the use of a conventional biasing resistor and results in better noise performance. Furthermore, as compared with a conventional biasing resistor (which, in a high impedance circuit, has a high resistance value and correspondingly high build-up time) the diode embodiment produces faster initial settling time and faster recovery from saturating transients for equivalent amplifier bandwidth. As will be described below, when the biasing voltage is obtained from a suitable source to ground resistor (as shown in FIGURE 8), only a single biasing diode is required.

Referring now to FIGURE 6 a conventional transistor 380 is connected in series intermediate output junction 340 and the drain electrode 326 of FET amplifier 318 having drain load FET 320. Transistor 380 is connected in a grounded base arrangement and serves to isolate FET 318 from its load. By the elimination of the drain resistance of FET 318 as a load thereon, the voltage gain of the amplifier is increased. Furthermore, a lower input capacitance is achieved, by virtue of the considerable reduction of the A.-C. excursion of drain 326 of FET 318, whereby the "Miller effect" capacitance is reduced.

As shown in FIGURE 7, the circuit of FIGURE 6 may be modified to provide for "bootstrapping" of the drain 426 of FET amplifier 418. Resistor 482 is connected between the base electrode of isolating transistor 480 and the source of FET amplifier 418. Capacitor 484 is connected in parallel with resistor 482 so that source electrode 422 is connected with the base of transistor 480, thereby virtually eliminating the effect of drain-gate capacitance at the input of the circuit. If desired, a voltage regulator diode or similar device may be substituted for the R-C network 482, 484.

Figure 8:
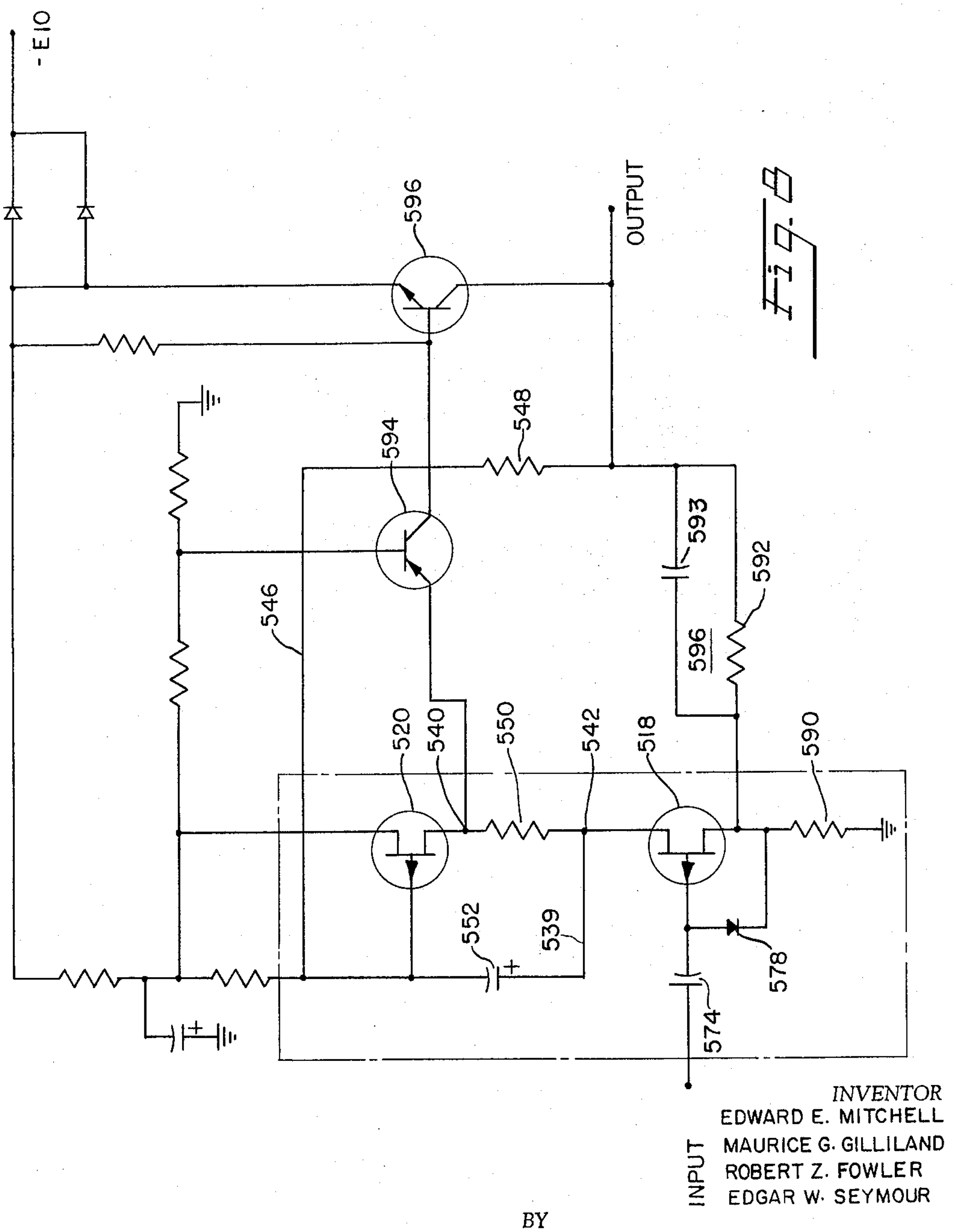

FIGURES 8 and 9 illustrate multi-stage solid-state amplifier characteristics of increased stability. In these amplifiers, gain, bandwidth, and phase shift are insensitive to operating temperature and source characteristics over wide limits. The amplifier of FIGURE 8 is especially suitable for use with piezoelectric transducers, such as hydrophones, and other medium-to-high impedance sources where outstanding noise performance is required. This amplifier provides excellent operation from capacitive sources.

Referring to FIGURE 8, the input signal is applied to the gate electrode of FET amplifier 518 that includes as its drain load the field-effect transistor 520. As in the embodiment of FIGURE 4, a resistor 550 is connected between output junction 540 of this stage and the drain of FET 518 and capacitor 552 is connected between terminal 542 and the gate electrode of FET load 520. As in the embodiment of FIGURE 5, diode means (578) and resistor 590 are provided for biasing the gate electrode of FET amplifier 518. Since the biasing voltage is obtained from source resistor 590 and no reverse bias is applied to the gate, only a single diode 576 is required. The output signal from the initial amplifier stage appearing at junction 540 is applied to the base electrode of output stage transistor amplifier 592 via transistor 594. A portion of the amplified output voltage appearing at the collector of transistor 596 is fed back to the gate electrode of FET load 520 via conductor 546 and feedback resistor 548. Resistor 592 and capacitor 593 are connected in parallel to define a network 596 that is connected between the output terminal and the source electrode of FET amplifier 518. As is conventional in the amplifier art, resistors 592 and 590 determine the effective amplifier gain. The remaining circuitry of the amplifier is conventional and need not be described in detail.

In the amplifier system of FIGURE 9, field-effect transistor 620 constitutes the collector load of a conventional transistor amplifier 638. As in the embodiment of FIGURE 4, a resistor 650 is connected between output junction 640 and the collector of transistor 638, and capacitor 652 is connected between junction 642 and the gate 632 of FET 620. Furthermore, a portion of the output signal from the output stage amplifier 692 is fed back to the gate electrode 632 of FET load 620 via conductor 646 and resistor-diode network 648. The diode branch of network 648 affords a decrease in the amplifier recovery time as is conventional in the art.

While in accordance with the provision of the patent statutes, the preferred forms and embodiments of the invention have been illustrated and described, it will be apparent to those skilled in the art that changes may be made in the apparatus described without deviating from the invention set forth in the following claims.

What is claimed is:

1. Electric signal amplifying means, comprising a solid-state amplifier including a control electrode adapted to receive an input signal to be amplified, and a pair of output circuit electrodes;

a first transistor having emitter, collector and base electrodes;

a field-effect transistor including source, drain and gate electrodes;

a source of direct-current load voltage;

conductor means connecting successively in series with said voltage source the output circuit electrodes of the amplifier, the emitter to collector circuit of the first transistor, and the source to drain circuit of the field-effect transistor, said conductor means including an output junction between the first transistor and the field effect transistor;

and means applying a biasing voltage to said base electrode.

2. Apparatus as defined in claim 1 wherein said amplifier device comprises a field-effect transistor having a drain electrode connected with the emitter to collector circuit of said transistor, a gate electrode constituting said control electrode, and a source electrode;

and means connecting the base electrode of said transistor with the source electrode of said amplifier device.

3. Apparatus as defined in claim 2 wherein said means connecting said base and source electrodes includes a series-connected resistor, whereby bootstrapping of the drain electrode of the amplifier device is afforded.

4. Apparatus as defined in claim 3, and further including a capacitor connected in parallel with said bootstrapping resistor, whereby the effect of drain-gate capacitance at the input of the circuit is eliminated.

5. Electric signal amplifying means, comprising a solid-state amplifier including a control electrode adapted to receive an input signal to be amplified, and a pair of output circuit electrodes;

a load impedance;

a field effect transistor including source, drain and gate electrodes;

a source of direct-current load voltage;

conductor means connecting successively in series with said voltage source the output electrode circuit of said amplifier, said load impedance, and the source to drain circuit of said field effect transistor, said condutcor means containing a first stage output junction between said load impedance and said source electrode;

a capacitor connecting said gate electrode with a point on said conductor means between said impedance and the amplifier output circuit electrode connected thereto;

an additional amplifier stage having an input terminal connected with said first stage output junction, a second stage output terminal, and a feedback output terminal;

and direct-current bias means for stabilizing the output voltage of said additional amplifier stage including a resistor connecting said feedback output terminal with said gate electrode.

6. Electric signal amplifying means, comprising first and second field effect transistors each including source, gate and drain electrodes;

a load impedance;

a source of direct-current load voltage;

conductor means connecting successively in series with said voltage source the source to drain circuit of said first field effect transistor, the load impedance, and the source to drain circuit of said second field effect transistor, said conductor means containing a first stage output junction between said load impedance and the source to drain circuit of said second field effect transistor;

a capacitor connecting the gate electrode of said second field-effect transistor with a point on said conductor means between said impedance and the source to drain circuit of said first field-effect transistor;

an additional amplifier stage having an input terminal connected with said first stage output junction, a second stage output terminal, and a feedback output terminal;

feedback resistor means connecting said feedback output terminal with the gate electrode of said second field-effect transistor;

means including a series-connected input capacitor for applying an input signal to be amplified upon the gate electrode of said first field-effect transistor;

and biasing means including at least one diode for applying a biasing voltage upon the gate electrode of said first field-effect transistor, whereby the diode cooperates with said input capacitor to produce a rapid settling time, improved noise performance, and high input impedance.

7. Apparatus as defined in claim 6, wherein said biasing means comprises a second source of biasing voltage;

and network means including a pair of parallel-connected diodes of opposite polarity connected at one end with the gate electrode of said first field-effect transistor and at the other end with said second source.

8. Apparatus as defined in claim 6, wherein said biasing means comprises a biasing resistor connected in series in said conductor means between said source and the source electrode of said first-effect transistor;

and means connecting said one diode at one end with the gate electrode of said first field-effect transistor and at the other end with one end of said biasing resistor.

References Cited by the Examiner

UNITED STATES PATENTS

| | | | |
|---|---|---|---|
| 2,631,197 | 3/1953 | Wilkomerson et al. | 330—165 X |
| 2,703,825 | 3/1955 | Macdonald | 330—140 X |
| 2,802,070 | 8/1957 | Fishbine et at. | 330—70 X |
| 2,861,239 | 11/1958 | Gilbert. | |
| 2,935,697 | 5/1960 | McManis. | |
| 3,082,380 | 3/1963 | Herrmann | 330—18 |
| 3,204,191 | 8/1965 | Redwood | 330—18 X |
| 3,208,002 | 9/1965 | Macdonald. | |

FOREIGN PATENTS

| | | |
|---|---|---|
| 1,158,480 | 1/1958 | France. |

OTHER REFERENCES

"Field Effect Transistors," No. 2, June 1962, Amelco Semiconductor, Mountain View, Calif., 8 pages.

Szekley, "Integrated Linear Audio Frequency Amplifier," RCA TN No. 454, September 1961, 2 sheets.

Bignell, ". . . Maximum Input Impedance With Field-Effect Transistors," Electronics, March 8, 1963, pages 44–46.

ROY LAKE, *Primary Examiner.*

F. D. PARIS, *Assistant Examiner.*